(12) United States Patent
Hara

(10) Patent No.: US 6,885,431 B2
(45) Date of Patent: Apr. 26, 2005

(54) EXPOSURE APPARATUS AND METHOD OF MANUFACTURING A SEMICONDUCTOR DEVICE USING THE SAME

(75) Inventor: Hiromichi Hara, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/658,207

(22) Filed: Sep. 10, 2003

(65) Prior Publication Data

US 2004/0057031 A1 Mar. 25, 2004

(30) Foreign Application Priority Data

Sep. 17, 2002 (JP) .................................... 2002-270554

(51) Int. Cl.[7] ...................... G03B 27/42; G03B 27/52; G03B 27/58
(52) U.S. Cl. ............................ 355/53; 355/30; 355/72
(58) Field of Search .................... 355/30, 53, 72–76

(56) References Cited

U.S. PATENT DOCUMENTS

| | | | |
|---|---|---|---|
| 5,559,584 A | 9/1996 | Miyaji et al. ................. | 355/73 |
| 5,881,987 A | 3/1999 | Hara ........................... | 248/550 |
| 6,341,006 B1 | 1/2002 | Murayama et al. .......... | 355/53 |
| 6,493,062 B1 | 12/2002 | Tokuda et al. ................ | 355/53 |
| 6,493,065 B1 | 12/2002 | Ina et al. ...................... | 355/53 |
| 6,621,556 B1 * | 9/2003 | Iwasaki et al. ............... | 355/53 |
| 2002/0018190 A1 * | 2/2002 | Nogawa et al. .............. | 355/30 |
| 2002/0163631 A1 * | 11/2002 | Sogard ........................ | 355/74 |
| 2004/0017556 A1 * | 1/2004 | Nakahara .................... | 355/70 |

FOREIGN PATENT DOCUMENTS

| | | |
|---|---|---|
| EP | 1 069 448 A1 | 7/2000 |
| JP | 6-260385 | 9/1994 |
| JP | 8-279458 | 10/1996 |
| JP | 2001-27727 | 1/2001 |

OTHER PUBLICATIONS

Okabe, Hideo. "Photochemistry of Small Molecules," A Wiley–Interscience Publication, 1978, pp. 178–179.

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus has a structure supported by a vibration isolating mechanism and a partition wall inserted in at least part of the optical path of exposure light used in the exposure apparatus. The structure and partition wall are coupled by an elastic seal member to form a closed space, and the interior of the partition wall is partitioned from the remaining space.

15 Claims, 6 Drawing Sheets

EXPOSURE APPARATUS AND METHOD OF MANUFACTURING A SEMICONDUCTOR DEVICE USING THE SAME

FIELD OF THE INVENTION

The present invention relates to an exposure apparatus which transfers a mask pattern onto a photosensitive substrate via a projection optical system.

BACKGROUND OF THE INVENTION

A conventional manufacturing process for a semiconductor element such as an LSI or VLSI formed from a micropattern uses a reduction type projection exposure apparatus for printing and forming by reduction projection a circuit pattern drawn on a mask onto a substrate coated with a photosensitive agent. With an increase in the packaging density of semiconductor elements, demands have arisen for further micropatterning. Exposure apparatuses are coping with micropatterning along with the development of a resist process.

A means for increasing the resolving power of the exposure apparatus includes a method of changing the exposure wavelength to a shorter one, and a method of increasing the numerical aperture (NA) of the projection optical system.

As for the exposure wavelength, a KrF excimer laser with an oscillation wavelength of 365-nm i-line to recently 248 nm, and an ArF excimer laser with an oscillation wavelength around 193 nm have been developed. A fluorine ($F_2$) excimer laser with an oscillation wavelength around 157 nm is also under development.

An ArF excimer laser with a wavelength around far ultraviolet rays, particularly, 193 nm, and a fluorine ($F_2$) excimer laser with an oscillation wavelength around 157 nm are known to have a plurality of oxygen ($O_2$) absorption bands around their wavelength bands.

For example, a fluorine excimer laser has been applied to an exposure apparatus because of a short wavelength of 157 nm. The 157 nm wavelength falls within a wavelength region generally called a vacuum ultraviolet region. In this wavelength region, light is greatly absorbed by oxygen molecules, and hardly passes through air. Thus, the fluorine excimer laser can only be used in an environment in which the atmospheric pressure is decreased to almost vacuum and the oxygen concentration is fully decreased. The absorption coefficient of oxygen to 157 nm light is about 190 atm 1 cm 1 (e.g., "Photochemistry of Small Molecules" (Hideo Okabe, A Wiley Interscience Publication, 1978, p. 178)). This means that, when 157 nm light passes through gas at an oxygen concentration of 1% at one atmospheric pressure, the transmittance per cm is only $$T=\exp(190\times1 \text{ cm}\times0.01 \text{ atm})=0.150.$$

Oxygen absorbs light to generate ozone ($O_3$), and ozone promotes absorption of light, greatly decreasing the transmittance. In addition, various products generated by ozone are deposited on the surface of an optical element, decreasing the efficiency of the optical system.

To prevent this, the oxygen concentration in the optical path is suppressed to a low level, of several ppm order or less, by a purge means using inert gas such as nitrogen in the optical path of the exposure optical system of a projection exposure apparatus using a far ultraviolet laser such as an ArF excimer laser or a fluorine (F2) excimer laser as a light source.

In such an exposure apparatus using an ArF excimer laser beam with a wavelength around far ultraviolet rays, particularly, 193 nm, or a fluorine (F2) excimer laser beam with a wavelength around 157 nm, an ArF excimer laser beam or fluorine (F2) excimer laser beam is readily absorbed by a substance. The optical path must be purged to several ppm order or less. This also applies to moisture, which must be removed to the ppm order or less.

To ensure the transmittance or stability of ultraviolet rays, the ultraviolet path of the reticle stage of an exposure apparatus or the like is purged with inert gas. As the purge method, there is proposed a method of spraying inert gas toward a photosensitive substrate. However, oxygen and moisture cannot be satisfactorily purged (see, e.g., Japanese Patent Laid-Open No. 6-260385). As another method, the whole space near a photosensitive substrate is covered with a sealing member from the lower end of a projection optical system. However, this method is not practical because it is difficult to move the stage (e.g., Japanese Patent Laid-Open No. 8-279458).

As described above, an exposure apparatus using ultraviolet rays, particularly, an ArF excimer laser beam or fluorine (F2) excimer laser beam suffers from large absorption by oxygen and moisture at the wavelength of the ArF excimer laser beam or fluorine (F2) excimer laser beam. To obtain a sufficient transmittance and stability of ultraviolet rays, the oxygen and moisture concentrations must be reduced.

From this, it is desired to develop an effective means for purging the ultraviolet path in an exposure apparatus, particularly, the vicinities of a wafer and reticle with inert gas.

The exposure apparatus is equipped with many devices such as the motors, air compressors, electric boards, and electric cables of various units. These units generate a vaporized substance and air which leaks from the air compressors. If a purge chamber is installed on the floor to purge the overall exposure apparatus including these units, the purged space is contaminated or the oxygen concentration decreases due to a substance vaporized from the units and air which leaks from the air compressors.

When the purge chamber is arranged on the exposure apparatus main body supported by a vibration isolating mechanism, vibrations of the panel of the box-like purge chamber made of a metal thin plate or the like are mixed as noise in the signal of a laser interferometer used for stage alignment on the exposure apparatus main body, adversely affecting the stage alignment precision.

In the exposure apparatus, loading/unloading of a wafer and reticle and maintenance around the wafer stage and reticle must be executed. It is difficult to partially seal these spaces.

SUMMARY OF THE INVENTION

The present invention has been made to overcome the conventional drawbacks, and has as its object to provide an exposure apparatus which can easily purge only minimum spaces near a wafer and reticle, and provide a purge structure capable of preventing any adverse effect on the stage alignment precision.

According to the present invention, the foregoing object is attained by providing an exposure apparatus which transfers a mask pattern onto a substrate via a projection optical system, comprising:

a structure which is supported by a vibration isolating mechanism; and a partition wall which is inserted in at least part of an optical path of exposure light used in the exposure apparatus, wherein the structure and the partition wall are coupled by an elastic seal member to form a closed space, and an interior of the partition wall is partitioned from a remaining space.

In a preferred embodiment, the partition wall is arranged on a structure which is different from the structure and supported by a vibration isolating mechanism.

In a preferred embodiment, at least one of a wafer stage and a reticle stage is arranged in the closed space within the partition wall.

In a preferred embodiment, the exposure apparatus further comprises gas supply means for supplying gas into an internal space of the partition wall.

In a preferred embodiment, the gas supplied by the gas supply means includes clean dry air or inert gas.

In a preferred embodiment, an elastic seal member is used at a connection portion between the partition wall and the gas supply means.

In a preferred embodiment, the partition wall comprises an openable/closable door or lid.

In a preferred embodiment, the partition wall is coupled by an elastic seal member to another partition wall which forms a closed space different from the closed space.

In a preferred embodiment, the other partition wall which forms the different closed space is arranged on a structure which is supported by an independently arranged vibration isolating mechanism.

In a preferred embodiment, the other partition wall which forms the different closed space includes a partition wall which covers at least one of a wafer transfer system and a reticle transfer system.

In a preferred embodiment, the exposure apparatus further comprises:

a stage device which moves while holding a mask or a substrate;

a reaction force receiving structure which is arranged outside the partition wall independently of the structure supported by the vibration isolating mechanism in order to receive a reaction force upon driving the stage device; and a force actuator which generates a force between the stage device and the reaction force receiving structure, wherein the force actuator is arranged via a through-hole formed in the partition wall, and an elastic seal member is used between the through-hole and the force actuator to keep the internal space of the partition wall airtight.

In a preferred embodiment, the elastic seal member is formed from a flexible material which allows folding a thin plate-like member into an accordion zigzag shape or modifying the thin plate-like member.

In a preferred embodiment, the elastic seal member is formed from a metal thin film, a resin, or a composite material of the metal thin film and the resin.

According to the present invention, the foregoing object is attained by providing a semiconductor device manufacturing method of manufacturing a semiconductor device by using an exposure apparatus which transfers a mask pattern onto a substrate via a projection optical system, the method comprising:

a coating step of coating the substrate with a photosensitive agent;

an exposure step of exposing the substrate by the exposure apparatus; and a step of developing the exposed substrate, wherein the exposure apparatus includes a structure which is supported by a vibration isolating mechanism, and a partition wall which is inserted in at least part of an optical path of exposure light used in the exposure apparatus, the structure and the partition wall are coupled by an elastic seal member to form a closed space, and an interior of the partition wall is partitioned from a remaining space.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENT

A preferred embodiment of the present invention will be described in detail below with reference to the accompanying drawings.

An exposure apparatus according to the present invention is not limited to the contents of the following embodiment, and is applied to a known exposure apparatus as far as a mask pattern is transferred onto a photosensitive substrate via a projection optical system by using ultraviolet rays as exposure light.

Ultraviolet rays as exposure light used in the exposure apparatus of the present invention are not limited. As described in the BACKGROUND OF THE INVENTION section, the present invention is effective for far ultraviolet rays, particularly, an ArF excimer laser beam with a wavelength around 193 nm and a fluorine (F2) excimer laser beam with a wavelength around 157 nm.

The embodiment of the present invention will be described with reference to FIG. 1.

Figure 1:
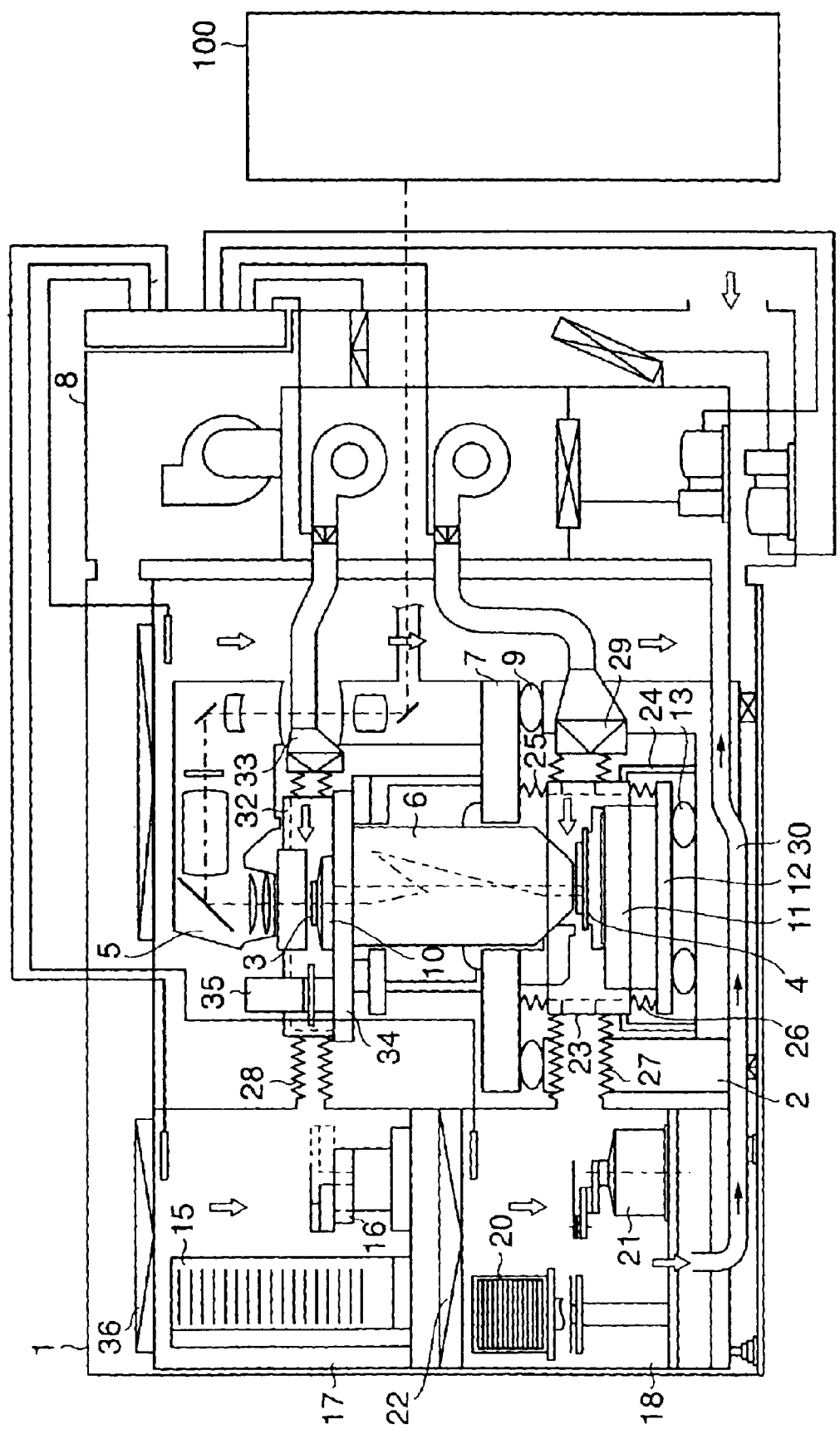
FIG. 1 is a schematic view showing a semiconductor device manufacturing exposure apparatus according to an embodiment of the present invention.

FIG. 1 is a schematic view showing a semiconductor device manufacturing exposure apparatus according to the embodiment of the present invention.

The exposure apparatus main body is stored in a chamber 1, and the ambient temperature is controlled to about ±0.03° C.

In FIG. 1, the exposure apparatus comprises, as main structures which constitute the exposure apparatus, a base frame 2 serving as the base of the exposure apparatus main body, a reticle stage 3 which can move while holding a reticle as an object to be exposed, a wafer stage 4 which can move while holding a wafer as an object to be exposed, an illumination optical system 5 which illuminates a reticle with illumination light, a projection optical system 6 which reduces and projects a reticle pattern onto a wafer at a predetermined magnification (e.g., 4:1), a lens barrel surface plate 7 which holds the projection optical system 6, and an air-conditioned equipment room 8 (gas supply mechanism) which supplies temperature-controlled gas (purge gas) such as clean dry air or inert gas.

The projection optical system 6 is a single barrel type catadioptric system, similar to a projection optical system disclosed in Japanese Patent Laid-Open No. 2001-27727. The projection optical system 6 has a closed structure, and its interior is purged with temperature/humidity-controlled inert gas such as nitrogen or helium.

The illumination optical system 5 incorporates a light source, or introduces illumination light via a beam line extending from a light source device 100 which is set on the floor separately from the exposure apparatus. The illumination optical system 5 generates slit light via various lenses and stops, and slit-illuminates a reticle serving as a master held by the reticle stage 3 from above the reticle. Examples of illumination light are an excimer laser beam (e.g., KrF, ArF, or $F_2$), harmonic (e.g., YAG laser beam or metal vapor laser beam), and ultraviolet rays (e.g., i-line). The illumination optical system 5 has a closed or almost closed structure, and its interior is purged with temperature/humidity-controlled inert gas such as nitrogen or helium.

The base frame 2 is set on the installation floor of the clean room of a semiconductor manufacturing factory. The base frame 2 is fixed to the floor at high rigidity, and can be regarded to be substantially integrated with the floor or extend from the floor. The base frame 2 includes three or four high-rigidity columns, and vertically supports the lens barrel surface plate 7 serving as a structure via active dampers A (9) at the tops of the columns.

The active damper A (9) is a vibration isolating mechanism which incorporates an air spring, a damper, and an actuator. The active damper A (9) prevents transmission of high frequency vibrations from the floor to the lens barrel surface plate 7, and actively compensates for the tilt or swing of the lens barrel surface plate 7.

The lens barrel surface plate 7 which holds the projection optical system 6 also supports a reticle stage surface plate 10 via a reticle holding frame 34. The lens barrel surface plate 7 is equipped with an alignment detector for detecting the alignment states of a reticle and wafer. Alignment is performed using the lens barrel surface plate 7 as a reference.

A wafer as a substrate is set on the wafer stage 4. The position of the wafer stage 4 is measured by an interferometer (not shown), and can be driven in an optical axis direction Z of the projection optical system 6, X and Y directions perpendicular to the Z direction, and $\omega x$, $\omega y$, and $\omega z$ directions around the axes. A linear motor is adopted as an alignment driving source. The wafer stage 4 basically comprises a two dimensional stage constituted by an X stage which moves straight in the X direction, an X linear motor, a Y stage which moves in the Y direction perpendicular to the X direction, and a Y linear motor. A stage capable of moving in the Z direction, tilt ($\omega X$ and $\omega Y$) directions, and rotational direction is mounted on the two dimensional stage.

The wafer stage 4 is supported by a wafer stage surface plate 11, and moves on the X-Y horizontal guide surface (guide surface) of the wafer stage surface plate 11. The wafer stage surface plate 11 is supported on a stage base member 12 serving as a structure by three (or four) support legs.

The stage base member 12 is vertically supported by the base frame 2 at three portions via three active dampers B (13). Most of the load of the stage base member 12 and members mounted on it is basically supported by the three active dampers B (13). The load received by the active dampers B (13) is received by the base frame 2 which is substantially integrated with the floor. Thus, the basic load of the wafer stage 4 is substantially supported by the floor. The active damper B (13) uses an air spring capable of supporting a large load.

Figure 2:
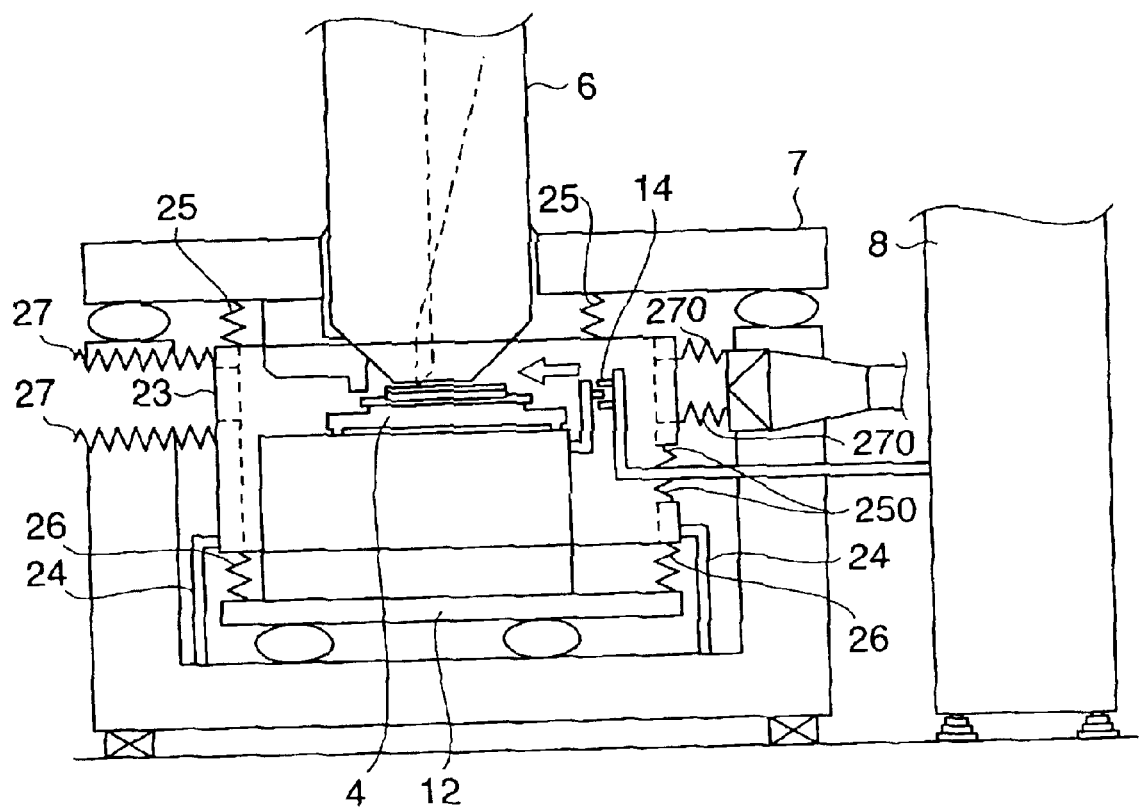
FIG. 2 is a schematic view showing the purge chamber of the projection exposure apparatus according to the embodiment of the present invention.

As shown in FIG. 2, a force actuator 14 which generates a thrust in the horizontal direction is interposed between the stage base member 12 and the air-conditioned equipment room 8. The force actuator 14 can control force transmission between the stage base member 12 and the air-conditioned equipment room 8 by the generated variable thrust. In particular, the air-conditioned equipment room 8 functions as a reaction force receiving structure for receiving a reaction force upon driving the stage device.

The center of gravity of the wafer stage 4 and the force action point of the force actuator 14, which generates a thrust in the horizontal direction are flush with each other. Since a compensation force can be applied at the same level as a reaction force, the driving reaction force of the wafer stage 4 can be effectively canceled. The embodiment adopts a linear motor as the force actuator 14.

The significance of using a linear motor is as follows.

That is, the linear motor has a high control response and can control a generated force at high speed. In addition, the stationary and movable elements of the linear motor do not contact each other, and the force acts between them by a Lorentz force. While the noncontact state is maintained by the Lorentz force, the driving reaction force of the wafer stage 4 can be transmitted from the stage base member 12 to the air conditioned equipment room 8. Because of noncontact, the linear motor also comprises a mechanical filter function of cutting off transmission of vibrations.

The position of the reticle stage 3 is also measured by an interferometer (not shown), and can be driven in the X and Y directions perpendicular to the optical axis direction Z of the projection optical system 6.

By illumination of the illumination system 5, the pattern image of a reticle R is projected onto a wafer W held by the wafer stage 4 via the projection optical system 6. At this time, the wafer stage 4 and reticle stage 3 are relatively moved in a direction perpendicular to the optical axis direction of the projection optical system 6. As a result, the pattern image is transferred in a predetermined region on the wafer W. The same transfer operation is repeated by step & scan for a plurality of exposure regions on the wafer W, thereby transferring the pattern on the entire surface of the wafer W.

The reticle R is stored in a reticle storage 15 and transferred by a reticle transfer system 16. The reticle storage 15 and reticle transfer system 16 are arranged in a space 17 within the chamber 1. The reticle R is transferred by the reticle transfer system 16 to a reticle alignment unit 35. The reticle alignment unit 35 is fixed to the upper surface of the reticle holding frame 34, mounts/recovers the reticle R on/from the reticle stage 3, and aligns the position of the reticle R.

The wafer W is stored in a wafer storage 20 and transferred by a wafer transfer system 21. The wafer storage 20 and wafer transfer system 21 are arranged in a space 18 within the chamber. The wafer W is mounted/recovered on/from the wafer stage 4 by the wafer transfer system 21.

A purge chamber structure using a partition wall and elastic seal member near the wafer stage of the projection exposure apparatus of the embodiment will be explained with reference to FIGS. 1 to 3.

FIG. 2 is a schematic view showing the purge chamber of the projection exposure apparatus according to the embodiment of the present invention. FIG. 3 is a schematic perspective view showing the purge chamber according to the embodiment of the present invention.

Figure 4:
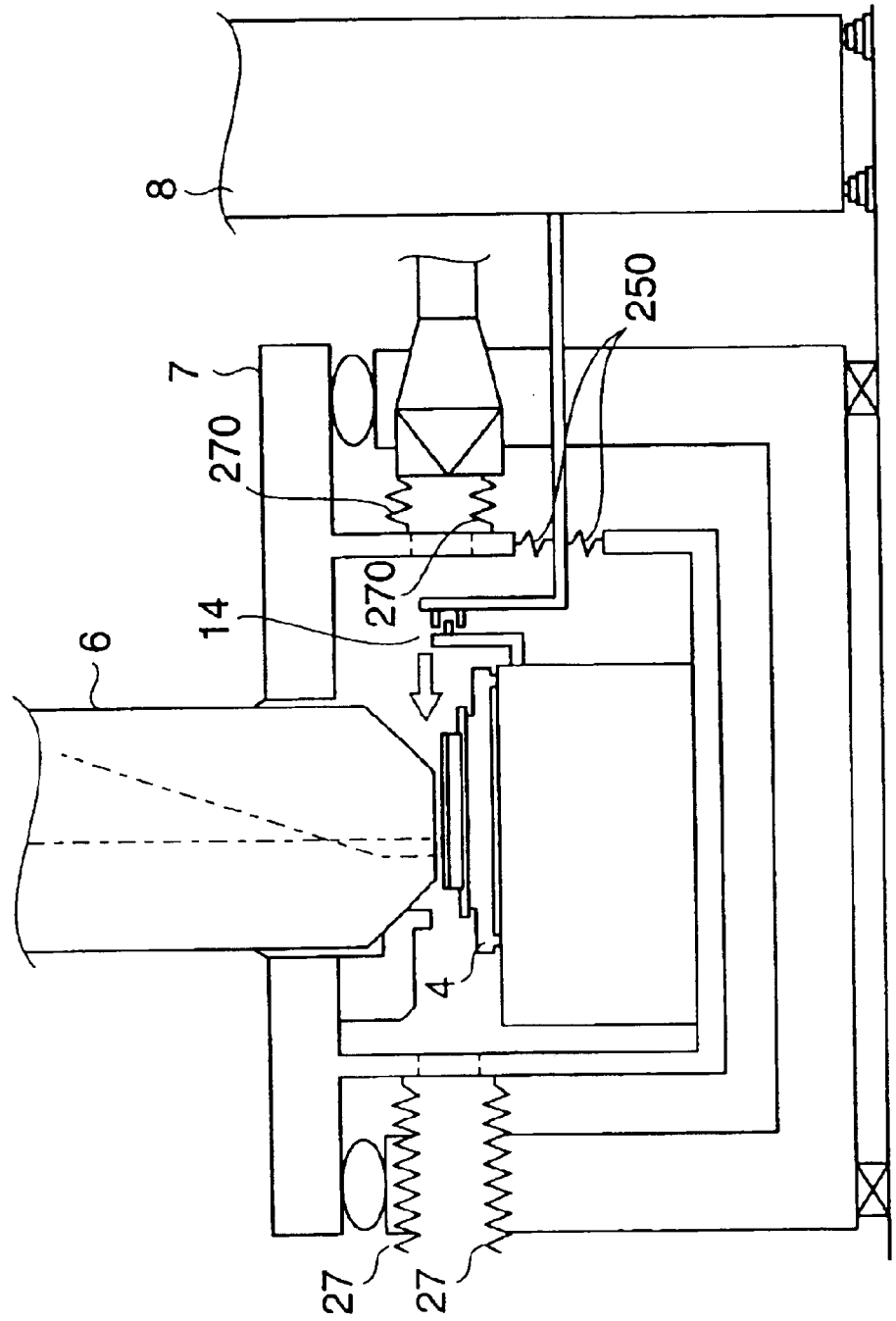
FIG. 4 is a schematic view showing a modification to the purge chamber of the projection exposure apparatus according to the embodiment of the present invention.

In the embodiment, as shown in FIG. 2, the lens barrel surface plate 7 and stage base member 12 are separately constituted. The present invention can also be applied when the lens barrel surface plate 7 and stage base member 12 are integrated, as shown in FIG. 4.

Figure 3:
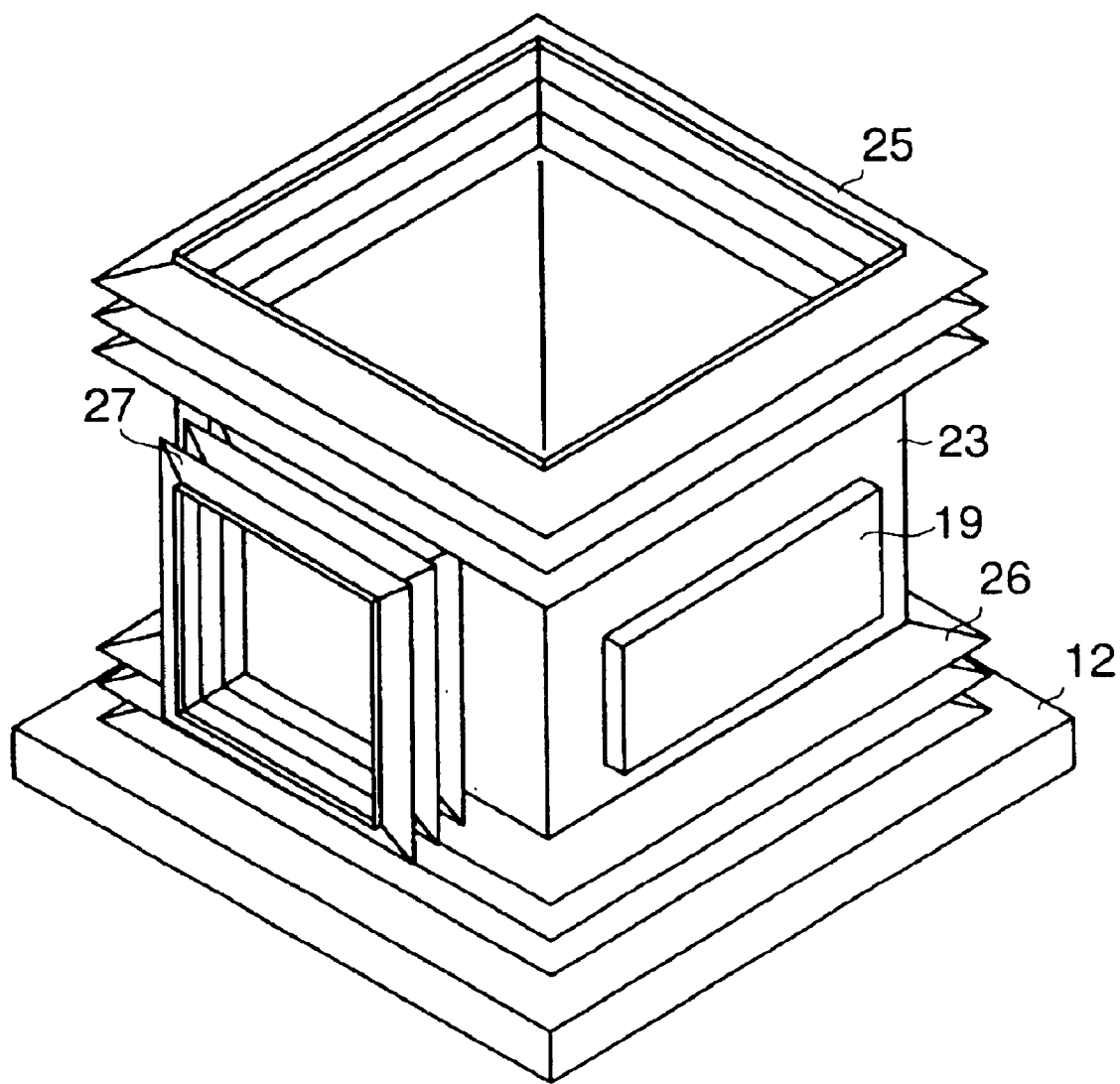
FIG. 3 is a schematic perspective view showing the purge chamber according to the embodiment of the present invention.

As shown in FIGS. 1 to 3, a box like partition wall A (23) is interposed between the lens barrel surface plate 7 and the wafer stage 4. The partition wall A (23) is supported by a support member 24 from the base frame 2. The partition wall A (23) has openings in the upper and lower surfaces. The upper opening and the facing lower surface of the lens barrel surface plate 7 are airtightly joined by a band like elastic seal member 25. The force actuator 14 is arranged via a through-hole formed in the side surface of the partition wall A (23). An elastic seal member 250 is used between the through-hole and the force actuator to maintain airtightness in the internal space of the partition wall A (23).

The lower opening of the partition wall A (23) and the facing upper surface of the stage base member 12 which supports the wafer stage 4 are also airtightly joined by a band-like elastic seal member 26. The elastic seal members 25 and 26 are very flexible, and can keep the interior of the partition wall A (23) airtight without transmitting vibrations of the box-like partition wall A (23) which swings by vibrations from the exposure apparatus installation floor, to the lens barrel surface plate 7 and wafer stage 4 which are supported by the active dampers A (9) and active dampers B (13) serving as a vibration isolating mechanism.

The box-like partition wall A (23) also has an opening on a side on which the wafer transfer system 21 is arranged. The opening of the partition wall A (23) of a chamber A (22) which covers the wafer transfer system 21 and a facing opening are also airtightly joined by a band-like elastic seal member 27. The chamber A (22) functions as a partition wall which covers the wafer transfer system 21.

Temperature-controlled inert gas such as nitrogen is supplied to a purge chamber space near the wafer stage 4 via a filter 29. A circulation system in which supplied air passes through the space 18, returns to the air-conditioned equipment room 8 again via a return portion 30, is temperature-controlled, and is then supplied is constituted. The filter 29 and partition wall A (23) are also airtightly joined by a band-like elastic seal member 270.

An openable/closable door or lid 19 for internal access is attached to the side surface of the partition wall A (23) in order to maintain a building component such as the wafer stage 4 in the partition wall A (23). A similar door or lid is also attached to a partition wall B (32) to be described later.

A purge chamber structure using a partition wall and elastic seal near the reticle stage 3 of the projection exposure apparatus according to the embodiment will be explained.

As shown in FIG. 1, the box-like partition wall B (32) is so arranged as to cover the reticle stage 3. The partition wall B (32) is supported by the reticle holding frame 34.

The box-like partition wall B (32) has an opening on a side on which the reticle transfer system 16 is arranged. The opening of a chamber B (36) which airtightly covers the reticle transfer system 16 and a facing opening are also airtightly joined by a band-like elastic seal member 28. The chamber B (36) functions as a partition wall which covers the reticle transfer system 16.

The elastic seal member 28 is very flexible and can keep the interior of the partition wall B (32) airtight without transmitting vibrations of the chamber of the reticle transfer system 16, which swings by vibrations from the exposure apparatus installation floor, to the lens barrel surface plate 7 and reticle stage 3, which are supported by the active dampers A (9).

Temperature-controlled inert gas such as nitrogen is supplied to a purge chamber space near the reticle stage 3 via a filter 33.

With this arrangement, the optical path of exposure light that extends from the illumination optical system 5 to the projection optical system 6 via a reticle and the optical path of exposure light that extends from the projection optical system 6 to a wafer are purged with inert gas such as nitrogen having high transmittance even for far ultraviolet rays such as an ArF excimer laser beam or a fluorine (F2) excimer laser beam.

Since illumination light reaches the wafer surface at high transmittance, the exposure time can be shortened to increase the throughput of the exposure process.

The lens barrel surface plate 7 and wafer stage 4 which are supported by the active dampers A (9) and active dampers B (13) are connected to the purge chamber via the elastic seal member, and do not receive any vibration of the purge chamber.

By constituting the motors, air compressors, electric boards, and electric cables of various units outside each purge chamber, these units can be partitioned from a closed space. This can solve the problem that the oxygen concentration is decreased by a substance vaporized from the units and air which leaks from the air compressors.

The elastic seal members 25 to 28, 250, and 270 are formed from a flexible material which allows folding a thin plate-like member into an accordion zigzag shape or modifying it. In addition to this material, the elastic seal members 25 to 28, 250, and 270 may be formed from a metal thin film, a resin, or a composite material of them.

As described above, according to the embodiment, the exposure apparatus comprises a structure which is supported by a vibration isolating mechanism (active dampers A (9) and active dampers B (13)) and constitutes an exposure apparatus main body, and a partition wall (partition wall A (23) and partition wall B (32)), which are arranged independently of the structure. The structure and partition wall are coupled by an elastic seal member (25 to 28, 250, and 270) to form a closed space so as to partition the interior of the partition wall from the remaining space.

A closed space can be formed and purged with purge gas by cutting off vibrations of the independently arranged partition wall by the elastic seal member so as not to transmit vibrations to the structure. Any adverse effect on the stage alignment precision can be prevented to increase the throughput. At the same time, a space concerning exposure processing can be partially sealed to print a high-precision pattern on a wafer.

The seal surface of the elastic seal member on the structure can be arbitrarily determined. Various units can be partitioned from a closed space by constituting the motors, air compressors, electric boards, and electric cables of the units in the structure outside the seal surface. Accordingly, the oxygen concentration and illuminance are not decreased by a substance vaporized from the units and air which leaks from the air compressors. The throughput can be increased, and a high-precision pattern can be printed on a wafer.

[Application of the Exposure Apparatus]

A semiconductor device manufacturing process using the above-described exposure apparatus will be explained.

Figure 5:
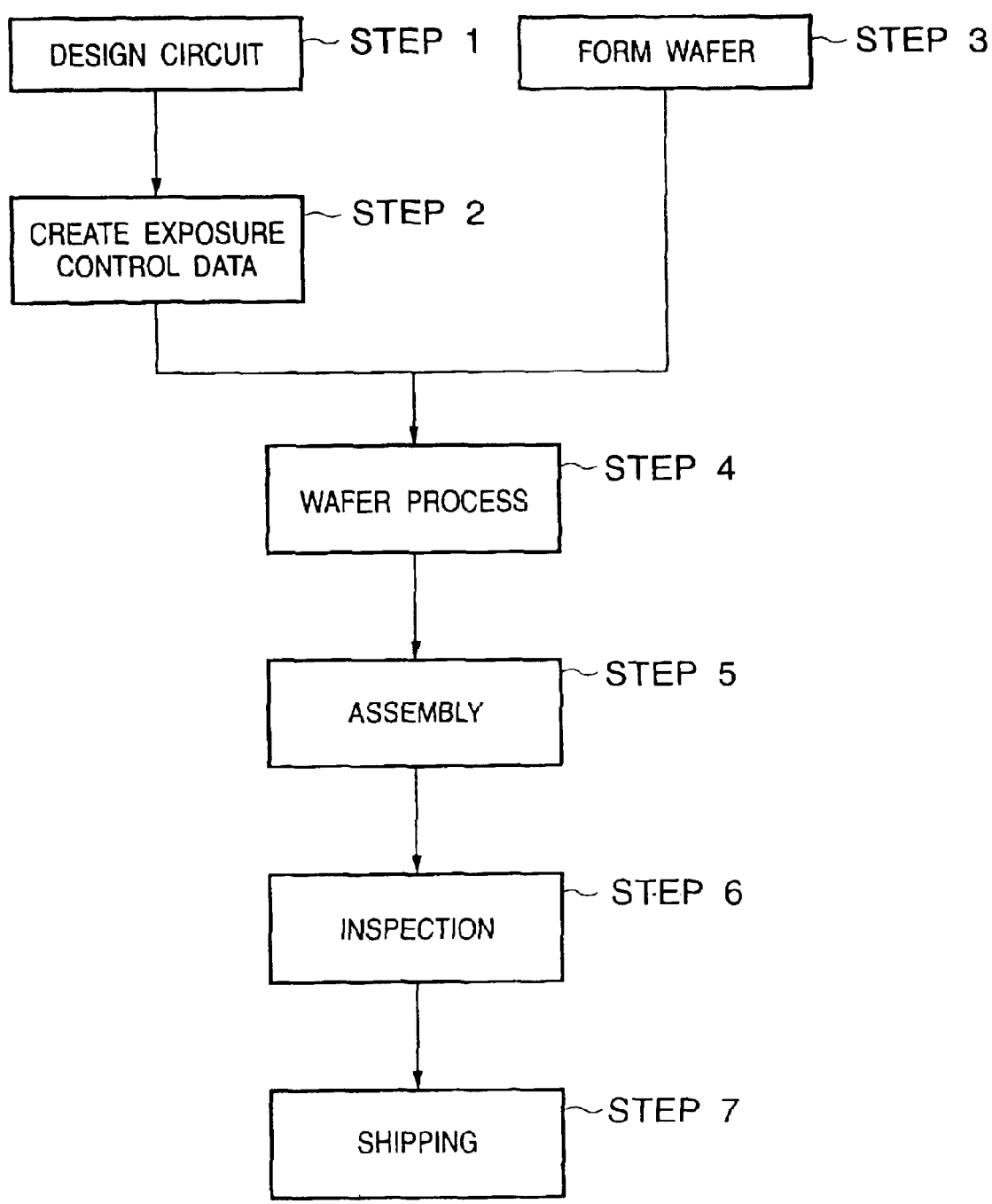
FIG. 5 is a flow chart showing the whole manufacturing process of a semiconductor device.

FIG. 5 is a flow chart showing the flow of the whole manufacturing process of a semiconductor device.

In step 1 (circuit design), the circuit of a semiconductor device is designed. In step 2 (mask formation), a mask is formed on the basis of the designed circuit pattern. In step 3 (wafer formation), a wafer is formed using a material such as silicon. In step 4 (wafer process), called a pre process, an actual circuit is formed on the wafer by lithography using the mask and wafer.

Step 5 (assembly), called a post process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped in step 7.

Figure 6:
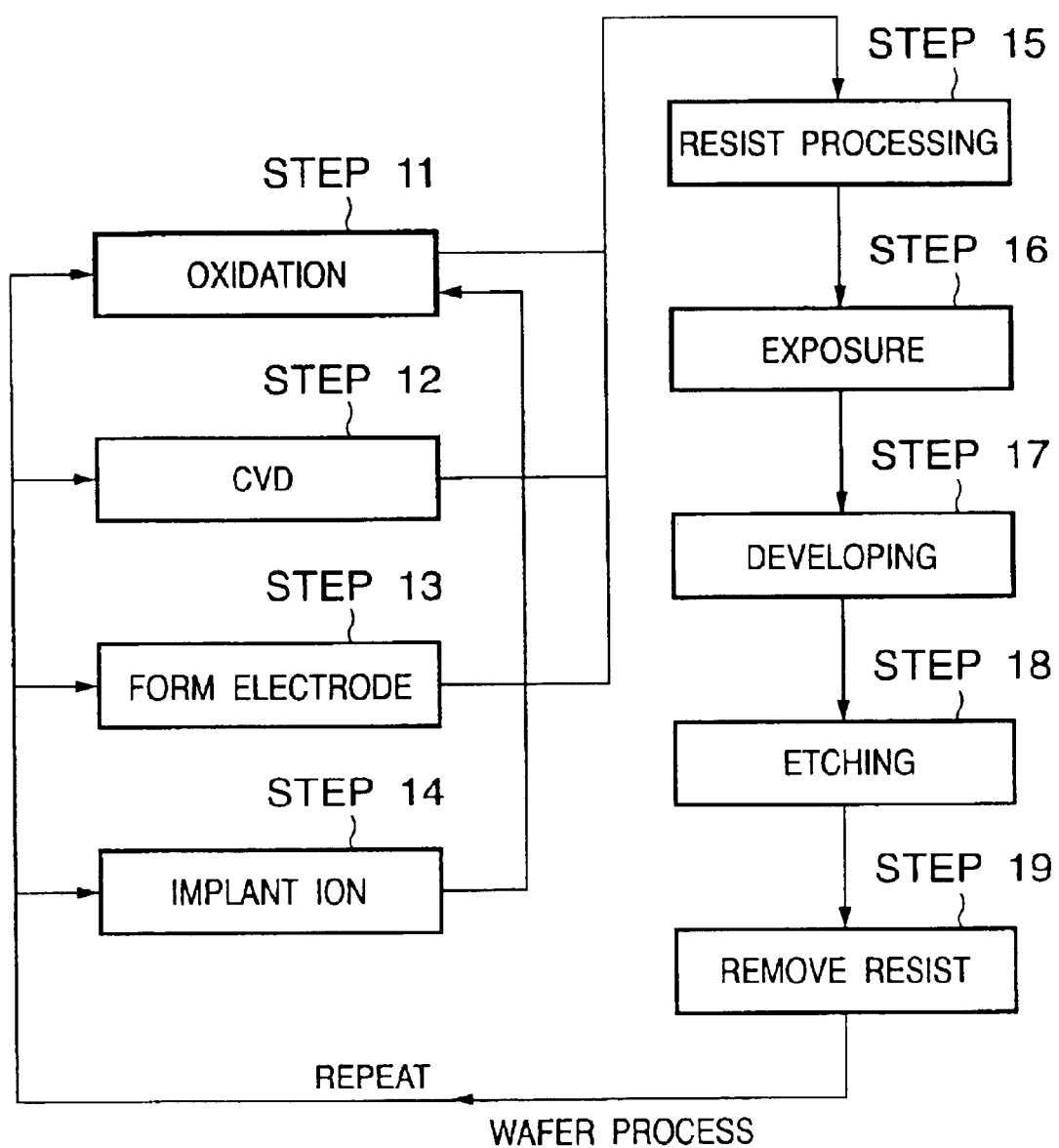
FIG. 6 is a flow chart showing the whole manufacturing process of the semiconductor device.

FIG. 6 is a flow chart showing the detailed flow of the wafer process.

In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above mentioned exposure apparatus transfers a circuit pattern onto the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus which has a projection optical system and transfers a pattern of a mask to a substrate via said projection optical system, said apparatus comprising:
   a base;
   a first structure;
   a first vibration isolating mechanism which is arranged on said base and supports said first structure;
   a first partition wall which defines a first space including an optical path of said projection optical system;
   a first elastic seal member which couples said first structure and said first partition wall, and seals the first space; and
   a first support member which is arranged on said base and is different from said first vibration isolating mechanism, and supports said first partition wall.

2. An apparatus according to claim 1, further comprising:
   a second structure;
   a second vibration isolating mechanism which is arranged on said base and is different from said first vibration isolating mechanism, and supports said second structure; and
   a second elastic seal member which couples said second structure and said first partition wall and seals the first space.

3. An apparatus according to claim 2, further comprising a second partition wall which defines a second space different from the first space and another elastic seal member which couples said first and second partition walls.

4. An apparatus according to claim 3, further comprising:
   a third structure which is different from said first and second structures; and
   a second support member which is different from said first support member and said first vibration isolating mechanism, and supports said third structure,
   wherein said second partition wall is arranged on said third structure.

5. An apparatus according to claim 1, further comprising a substrate stage to hold the substrate and move, and a mask stage to hold the mask and move,
   wherein at least one of said substrate stage and said mask stage is arranged in the first space.

6. An apparatus according to claim 5, further comprising:
   a reaction force receiving structure which receives a reaction force from one of said substrate stage and said mask stage via a through-hole formed in said first partition wall; and
   an elastic seal member which seal the through-hole via which said reaction force receiving structure is arranged.

7. An apparatus according to claim 1, further comprising a gas supply system which supplies a gas into the first space.

8. An apparatus according to claim 7, wherein the gas supplied by said gas supply system includes one of clean dry air and an inert gas.

9. An apparatus according to claim 7, further comprising another elastic seal member which couples a supply port of said gas supply system and said first partition wall.

10. An apparatus according to claim 1, wherein said partition wall comprises one of a door and a lid.

11. An apparatus according to claim 1, further comprising a second partition wall which defines a second space different from the first space and another elastic seal member which couples said first and second partition walls.

12. An apparatus according to claim 11, further comprising at least one of a substrate transfer system which transfers the substrate and a mask transfer system which transfers the mask, wherein at least one of said substrate transfer system and said mask transfer system is arranged in the second space.

13. An apparatus according to claim 1, wherein said first elastic seal member has a structure of a bellows.

14. An apparatus according to claim 13, wherein said first elastic seal member is formed from one of a metal film, a resin, and a composite material of the metal film and the resin.

15. A device manufacturing method comprising the steps of:
   transferring a pattern of a mask to a substrate using an exposure apparatus as recited in claim 1; and
   developing the substrate to which the pattern has been transferred.

* * * * *

UNITED STATES PATENT AND TRADEMARK OFFICE
CERTIFICATE OF CORRECTION

PATENT NO.     : 6,885,431 B2
DATED          : April 26, 2005
INVENTOR(S)    : Hiromichi Hara It is certified that error appears in the above-identified patent and that said Letters Patent is hereby corrected as shown below:

Title page,
Item [56], References Cited, U.S. PATENT DOCUMENTS,
"6,493,062 B1  12/2002  Tokuda et al. ………………………355/53" should read
-- 6,493,062 B2  12/2002  Tokuda et al. ………………………355/53 --; and
"6,493,065 B1  12/2002  Ina et al. ………………………..355/53" should read
-- 6,493,065 B2  12/2002  Ina et al. ………………………..355/53 --.

Column 1,
Line 28, "365-nm" should read -- 365 nm --.
Line 47, "190 atm 1 cm" should read -- 190 $atm^{-1}$ $cm^{-1}$ --.
Line 48, "1" should be deleted.
Line 49, "Wiley Interscience" should read -- Wiley-Interscience --.
Line 54, "$T$=exp(190×1 cm×0.01 atm)=0.150." should read -- $T$=exp(-190×1 cm×0.01 atm)=0.150. --.

Column 5,
Line 42, "high frequency" should read -- high-frequency --.

Column 7,
Line 24, "band like" should read -- band-like --.

Column 9,
Line 16, "pre process," should read -- pre-process --.
Line 19, "post process," should read -- post-process --.
Line 34, "above mentioned" should read -- above-mentioned --.

UNITED STATES PATENT AND TRADEMARK OFFICE
CERTIFICATE OF CORRECTION

PATENT NO. : 6,885,431 B2
DATED : April 26, 2005
INVENTOR(S) : Hiromichi Hara

It is certified that error appears in the above-identified patent and that said Letters Patent is hereby corrected as shown below:

<u>Column 10,</u>
Line 28, "which seal" should read -- which seals --.

Signed and Sealed this

Fourth Day of October, 2005

JON W. DUDAS
*Director of the United States Patent and Trademark Office*